(12) United States Patent
Essers et al.

(10) Patent No.: US 8,431,894 B2
(45) Date of Patent: Apr. 30, 2013

(54) ELECTRON BEAM DEVICE (75) Inventors: Erik Essers, Aalen (DE); Gerd Benner, Aalen (DE); Volker Drexel, Königsbronn (DE)

(73) Assignee: Carl Zeiss Microscopy GmbH, Jena (DE)

(*) Notice: Subject to any disclaimer, the term of this patent is extended or adjusted under 35 U.S.C. 154(b) by 424 days.

(21) Appl. No.: 11/659,145

(22) PCT Filed: Jul. 28, 2005

(86) PCT No.: PCT/EP2005/008216
§ 371 (c)(1),
(2), (4) Date: Oct. 14, 2008

(87) PCT Pub. No.: WO2006/015732
PCT Pub. Date: Feb. 16, 2006

(65) Prior Publication Data
US 2009/0039257 A1 Feb. 12, 2009

(30) Foreign Application Priority Data
Aug. 3, 2004 (DE) .................. 10 2004 037 781

(51) Int. Cl.
*G21K 7/00* (2006.01)
(52) U.S. Cl.
USPC .................. 250/307; 250/310; 250/492.2
(58) Field of Classification Search .......... 250/307
See application file for complete search history.

(56) References Cited

U.S. PATENT DOCUMENTS

| 4,393,310 | A | * | 7/1983 | Hahn | 250/398 |
| 4,714,833 | A | | 12/1987 | Rose et al. | |
| 4,982,091 | A | * | 1/1991 | Garth et al. | 250/310 |
| 5,406,178 | A | | 4/1995 | Yamazaki | |
| 5,576,833 | A | * | 11/1996 | Miyoshi et al. | 356/394 |
| 5,894,124 | A | | 4/1999 | Iwabuchi et al. | |
| 5,895,917 | A | | 4/1999 | Ueda et al. | |
| 6,104,034 | A | | 8/2000 | Frosien et al. | |
| 6,184,525 | B1 | | 2/2001 | Van Der Mast | |
| 6,194,729 | B1 | | 2/2001 | Weimer | |
| 6,218,664 | B1 | | 4/2001 | Krans et al. | |
| 6,426,501 | B1 | * | 7/2002 | Nakagawa | 850/5 |
| 6,437,353 | B1 | | 8/2002 | Benner | |

(Continued)

FOREIGN PATENT DOCUMENTS

DE 3703028 9/1988
DE 197 32 093 A1 1/1999

(Continued)

OTHER PUBLICATIONS

DE 37 03 028 A1, Scanning Microscope (full text computer translation).

(Continued)

*Primary Examiner* — Phillip A Johnston
(74) *Attorney, Agent, or Firm* — Muirhead and Saturnelli, LLC (57) ABSTRACT

An electron beam device has an electron gun for generating an electron beam, an objective lens for focusing the electron beam on an object and at least one detector for detecting electrons emitted by the object or electrons backscattered by the object. Detection of electrons emitted by or backscattered by an object may be simplified and improved using quadrupole devices and certain configurations of these devices provided in the electron beam device.

35 Claims, 9 Drawing Sheets

U.S. PATENT DOCUMENTS

| | | |
|---|---|---|
| 6,498,345 B1 | 12/2002 | Weimer et al. |
| 6,531,698 B1 | 3/2003 | Benner |
| 6,590,210 B1 | 7/2003 | Essers |
| 6,614,026 B1 | 9/2003 | Adamec |
| 6,815,698 B2 * | 11/2004 | Nagano et al. ........... 250/492.22 |
| 2002/0067482 A1 | 6/2002 | Lanio et al. |
| 2002/0088941 A1 | 7/2002 | Yonezawa |
| 2003/0098415 A1 | 5/2003 | Matsuya et al. |
| 2003/0183763 A1 | 10/2003 | Bertsche |
| 2003/0218133 A1 | 11/2003 | Petrov et al. |
| 2004/0036030 A1 | 2/2004 | Matsuya et al. |
| 2004/0075053 A1 | 4/2004 | Preikszas et al. |
| 2006/0192141 A1 | 8/2006 | Koops |

FOREIGN PATENT DOCUMENTS

| | | |
|---|---|---|
| DE | 198 45 329 A1 | 9/1999 |
| DE | 198 28 476 A1 | 12/1999 |
| DE | 198 55 629 A1 | 6/2000 |
| DE | 199 45 344 A1 | 3/2001 |
| DE | 103 02 794 A1 | 7/2004 |
| EP | 0661727 A2 | 7/1995 |
| EP | 0 910 109 A1 | 4/1999 |
| EP | 0 917 177 A1 | 5/1999 |
| EP | 0 917 178 A1 | 5/1999 |
| EP | 0 989 584 A1 | 3/2000 |
| JP | 5-325867 A | 12/1993 |
| JP | 2000-048752 A | 2/2000 |
| JP | 2001-015055 A | 1/2001 |
| WO | WO 99/46797 | 9/1999 |
| WO | WO 00/36630 | 6/2000 |

OTHER PUBLICATIONS

EP 0 917 178, Secondary corpuscule detector and its arrangement in a corpuscular beam apparatus (computer translation from German).

EP 0 917 177, Corpuscular Beam Apparatus (computer translation from German).

* cited by examiner

X-Schnitt

ELECTRON BEAM DEVICE

TECHNICAL FIELD

The present application relates to a method for detecting electrons and an electron beam device, in particular a scanning electron microscope having an electron gun for generating an electron beam, an objective lens for focusing the electron beam on an object, and at least one detector for detecting electrons emitted by the object or backscattered by the object.

BACKGROUND OF THE INVENTION

Electron beam devices, in particular scanning electron microscopes, are used for examining surfaces of objects (samples). To do so, an electron beam (hereinafter also referred to as a primary electron beam) is generated by an electron gun in a scanning electron microscope and is focused by the objective lens on the object to be examined. Using a deflecting device, the primary electron beam is guided in a grid pattern over the surface of the object to be examined. The electrons of the primary electron beam interact with the object. As a result of this interaction, electrons in particular are emitted from the object (so-called secondary electrons) or electrons of the primary electron beam are backscattered (so-called backscatter electrons). The backscatter electrons have an energy in the range of 50 eV up to the energy of the electrons of the primary electron beam on the object, while the secondary electrons have an energy of less than 50 eV. Secondary electrons and backscatter electrons form the secondary beam, as it is referred to below, and are detected by a detector. The detector signal generated in this way is used for image production.

Electron beam devices have a high positional resolution which is achieved due to the very small diameter of the electron beam in the plane of the object. The resolution is better, the closer the object is situated to the objective lens of the electron beam device. For detecting the secondary electrons or backscatter electrons, the detector is preferably situated inside the objective lens or in an area between the objective lens and the electron gun. Furthermore, the resolution can be improved, in particular with a primary electron energy of less than 10 keV by first accelerating the electrons of the primary electron beam in the electron beam device and then decelerating them to a desired final energy in the objective lens or in the area between the objective lens and the object. Such an electron beam device is described in DE 198 28 476 A1, for example.

There are known electron beam devices having an annular detector situated around the beam axis of the primary electron beam and having an opening, which is normally much larger than the beam cross section of the primary electron beam, so as not to influence the primary electron beam in the beam path of the electron beam device. The return paths of the secondary electrons and backscatter electrons in the electron beam device are influenced in different ways by the objective lens due to the different energies of the secondary electrons and backscatter electrons. The crossover of the beam of the secondary electrons occurs closer to the object to be examined than the crossover of the beam of the backscatter electrons. Under certain operating conditions, in particular at a high magnification and with a small working distance between the objective lens and the sample, the secondary and/or backscatter electrons travel on paths in such a way that a majority of the secondary electrons and backscatter electrons pass through the opening in the detector and therefore are not detected.

DE 198 28 476 A1 describes one possible approach for overcoming the disadvantage described above. With the electron beam device known from this publication, two detectors for the secondary electrons and the backscatter electrons, each having one opening, are offset from one another in the direction of the optical axis of the electron beam device. The first detector, which is situated near the object, is for detecting the electrons emerging from the object at a relatively large angle while the second detector, which is situated in the area of the electron gun, is for detecting the electrons that emerge from the object at a relatively small angle and pass through the opening in the first detector provided for passage of the primary electron beam.

Another proposed approach is known from EP 0 661 727 A2. This document relates to a scanning electron microscope in which secondary electrons and backscatter electrons are deflected on various paths to different detectors via a Wien filter. As an alternative, it is proposed that the detector be designed as a conversion electrode with which it is possible to detect either backscatter electrons or secondary electrons individually or simultaneously via a single detector.

Another Wien filter system is known from WO 00/36630. This document relates to a scanning electron microscope having two or three successive Wien filters that are used to deflect the Auger electrons emitted from an object. Quadrupole fields are superimposed on the Wien filters to compensate for the imaging errors caused by the dispersion in the Wien filters.

EP 0 989 584 A1 relates to two Wien filters that are provided for reducing the energy width of the primary electron beam and are designed as quadrupole filters.

Furthermore, EP-A-910 109 A1 describes an objective lens for influencing an electron beam with a magnetic single-pole lens and an electrostatic lens having a first and a second electrode which are equipped with different potentials. The electrostatic lens is situated downstream from the magnetic single pole lens in the direction of the electron beam, one of the two electrodes of the electrostatic lens being designed as a multipole. Moreover, an arrangement of magnetic multipole elements is also provided to form Wien filters together with the electrodes. These may be adjusted so that the primary electron beam is not influenced but any secondary electrons and backscatter electrons released on an object (sample) are deflected and sent to an extra-axial detector capable of detecting both signals jointly or separately due to a suitable design.

The disadvantage of all the Wien filter approaches is the relatively complex implementation in scanning electron microscopes because the beam guidance tube of the scanning electron microscope must usually be segmented.

Accordingly, it would be desirable to simplify and improve detection of electrons backscattered by an object or electrons emitted by an object in the case of an electron beam device.

SUMMARY OF THE INVENTION

According to the system described herein, an electron beam device, in particular a scanning electron microscope, is designed with an electron gun for generating an electron beam, an objective lens for focusing the electron beam on an object, and at least one detector for detecting electrons backscattered by the object or emitted by the object. The detector has a through-opening for the passage of the electron beam in the direction of the object. Furthermore, a first and a second quadrupole device connected in series are provided.

The electron beam device according to the system described herein is based on the finding that detection of secondary electrons or backscatter electrons may be improved by adjusting the beam cross section of the secondary electrons or backscatter electrons suitably. The adjustment is made in such a way that the beam of the secondary electrons or backscatter electrons is shaped by one of the quadrupole devices so that only a very small portion is able to pass through the through-opening in the detector. The larger portion of the secondary electrons and backscatter electrons strikes a detection surface of the detector and is detected. Using at least one additional quadrupole device, the effect on the primary electron beam is compensated. The system described herein thus ensures a high detection rate of secondary electrons and backscatter electrons using a simple axial arrangement. The use of magnetic quadrupoles as well as electrostatic quadrupoles is possible. The strength of the required quadrupole excitations varies, depending on the embodiment. If errors of a higher order resulting in particular in embodiments having stronger quadrupole excitation limit the resolution, they may be corrected by magnetic or electrostatic multipole elements of a higher order to such an extent that they no longer limit the resolution.

The detector is preferably situated symmetrically to the beam axis of the electron beam in the electron beam device. Furthermore, in another preferred exemplary embodiment, the first and second quadrupole devices are excited in the same direction.

Because of the spherical aberration of the objective lens, it is advantageous to position an aperture stop in the beam path of the electron beam upstream from one of the quadrupole devices. If the aperture stop is above a first quadrupole device which is closer to the electron gun than the other quadrupole device, an aperture stop having an elliptical opening is suitable because an elliptical beam bundle in the objective lens is obtained with an arrangement of an aperture stop having a round opening above the first quadrupole device but this is a disadvantage because of the opening error in the objective lens. As an alternative to the aperture stop having an elliptical opening, an aperture stop having a round opening is to be situated between the first quadrupole device and the detector. A round beam bundle in the objective lens may also be obtained in this way. In both of the alternatives mentioned above, the beam cross section of the electron beam on the electron gun is selected so that the cross section has a preferential direction because electrons from a larger angular range based on this preferential direction are used.

In another embodiment of the present invention, a third quadrupole device is provided in addition to the first and second quadrupole devices. The first, second, and third quadrupole devices are connected in series. Considerations have shown that this embodiment ensures that the virtual sources generated by the quadrupole device closest to the object will always coincide in this way. The imaging of the electron source acting as an electron gun via the objective lens on the object is performed in both the X direction and in the Y direction at an identical working distance, where the X direction and the Y direction are represented by two vectors which span the plane in which the cross section of the primary electron beam is situated. Thus the beam cross section of the primary electron beam remains round downstream from this quadrupole device.

The aforementioned embodiment having the three quadrupole devices is advantageously designed in such a way that two quadrupole devices are excited in the same direction and one quadrupole device is excited in the opposite direction. The additional quadrupole device situated between two of the quadrupole devices ensures that the cross section of the electron beam in the last quadrupole device (in the direction of the beam path of the primary electrons) will have a round shape. This last quadrupole device is situated close to the objective lens and ensures that the virtual sources of the electron gun generated by this quadrupole device will coincide in a plane parallel to the plane of the object. The cross section of the primary electron beam thus always retains its rotational symmetry even after imaging by the last quadrupole device.

The detector is preferably situated between two of the quadrupole devices. It is also provided that the quadrupole devices are to be designed as magnetic or electrostatic quadrupoles.

In another embodiment of the present invention, the second quadrupole device is situated closer to the object than the first quadrupole device. Moreover, the second quadrupole device is situated in the area of the objective lens. The first quadrupole device is preferably situated in the area of the electron gun.

Furthermore, an embodiment of the present invention relates to an electron beam device, in particular a scanning electron microscope on which an electron gun for generating an electron beam and an objective lens for focusing the electron beam on an object are provided. The objective lens has one side facing the electron gun and one side facing the object and is equipped with a magnetic lens and an electrostatic lens. The electrostatic lens has a first and a second electrode, the second electrode being situated on the object side and at a smaller distance from the object than the first electrode. Moreover, at least one quadrupole device is provided on the object side, the second electrode forming at least partially this quadrupole device. This electron beam device according to the present invention has at least one of the features mentioned above.

In this embodiment it is advantageous that the quadrupole device is situated very close to the object (sample). The quadrupole device thus acts much more strongly on the secondary electrons emitted by the object than on the electrons of the primary electron beam. Moreover, the quadrupole device may at the same time also be designed as a deflection device to scan the primary electron beam over the object.

In addition, it is advantageous to situate one of the quadrupole devices above the crossover of the emitted electrons (secondary electrons) in which the electrons (secondary electrons) emitted by the object are imaged. This makes it possible for a particularly high number of secondary electrons to strike the detector and be detected.

In a preferred embodiment of this electron beam device according to the present invention, the quadrupole device includes a component having an opening through which the electron beam passes in the direction of the object. The opening in the component is preferably not round, in particular elliptical. This nonround opening generates a strong electrostatic and slightly magnetic astigmatism via which the quadrupole field is generated.

It is advantageous that the component may be situated on the second electrode. The component may in particular be integrated into the second electrode. The second electrode preferably has an object side on which the component is situated. For example, the component may be attached to the second electrode by insulators and insulated from the second electrode. This embodiment has the advantage that the component also functions as contact protection so that the sample to be examined does not come in contact with the second electrode.

In a special embodiment, the component and the second electrode are at a predefinable potential. The potential of the second electrode is preferably variably adjustable. In this way, it is possible to select between a weak or a strong quadrupole field by suitably selecting the potential of the second electrode. The component is preferably grounded.

In another embodiment of the present invention, the opening in the detector is adjustable, i.e., the extent of the opening is adjustable. The opening in the detector is preferably designed in the form of a gap or has an elliptical shape. Furthermore, in addition or as an alternative, the detector may also be designed with at least two detector elements situated with respect to one another in such a way that they form the opening of the detector. For example, the detector elements are situated on an adjustment device with which the extent of the opening is adjustable by positioning the detector elements. Furthermore, the detector is preferably designed as a conversion stop. Secondary electrons or backscatter electrons striking this conversion stop in turn generates secondary electrons of a low energy that may be detected by a detector, e.g., a scintillation detector. It is also advantageous to situate the detector in a focus of one of the quadrupole devices.

According further to the system described herein, an electron beam device, in particular a scanning electron microscope, has an electron gun for generating an electron beam, an objective lens for focusing the electron beam on an object, the objective lens having a side facing the electron gun and a side facing the object, and at least one detector for detecting electrons backscattered by the object or emitted by the object, the detector having a through-opening for passage of the electron beam in the direction of the object. Furthermore, at least one quadrupole device situated on the object side is provided on the objective lens. The electron beam device preferably has at least one of the aforementioned features already described above.

According further to the system described herein, a method for detecting electrons in an electron beam device is provided. According to this method, a primary electron beam is generated and passed through the electron beam device. When the primary electron beam strikes an object to be examined, electrons (secondary electrons and backscatter electrons) are generated, forming a secondary beam. After it is generated, the primary electron beam passes through a first quadrupole that shapes the beam cross section of the primary electron beam so that the primary electron beam then passes through the opening in the detector in the direction of the object to be examined. Then the primary electron beam passes through a second quadrupole that shapes the beam cross section of the primary electron beam so that it is again essentially rotationally symmetrical. Furthermore, the secondary electron beam passes through the second quadrupole and is shaped by the second quadrupole so that only a small portion of the electrons of the secondary beam passes through the opening in the detector and the greater portion is detected by the detector.

The method according to the system described herein is explained in greater detail below.

The system described herein is not limited to a beam device for electrons. The system described herein may instead be used with any particle beam device, in particular an ion beam device having at least one of the aforementioned features.

BRIEF DESCRIPTION OF THE DRAWINGS

The system described herein will now be explained in greater detail on the basis of exemplary embodiments with reference to the figures.

DETAILED DESCRIPTION OF VARIOUS EMBODIMENTS

The system described herein is explained in greater detail below on the basis of the example of a particle beam device and/or an electron beam device in the form of a scanning electron microscope. However, it is not limited to scanning electron microscopes. Instead, the system described herein may be used with any particle beam device, in particular an ion beam device.

Figure 1:
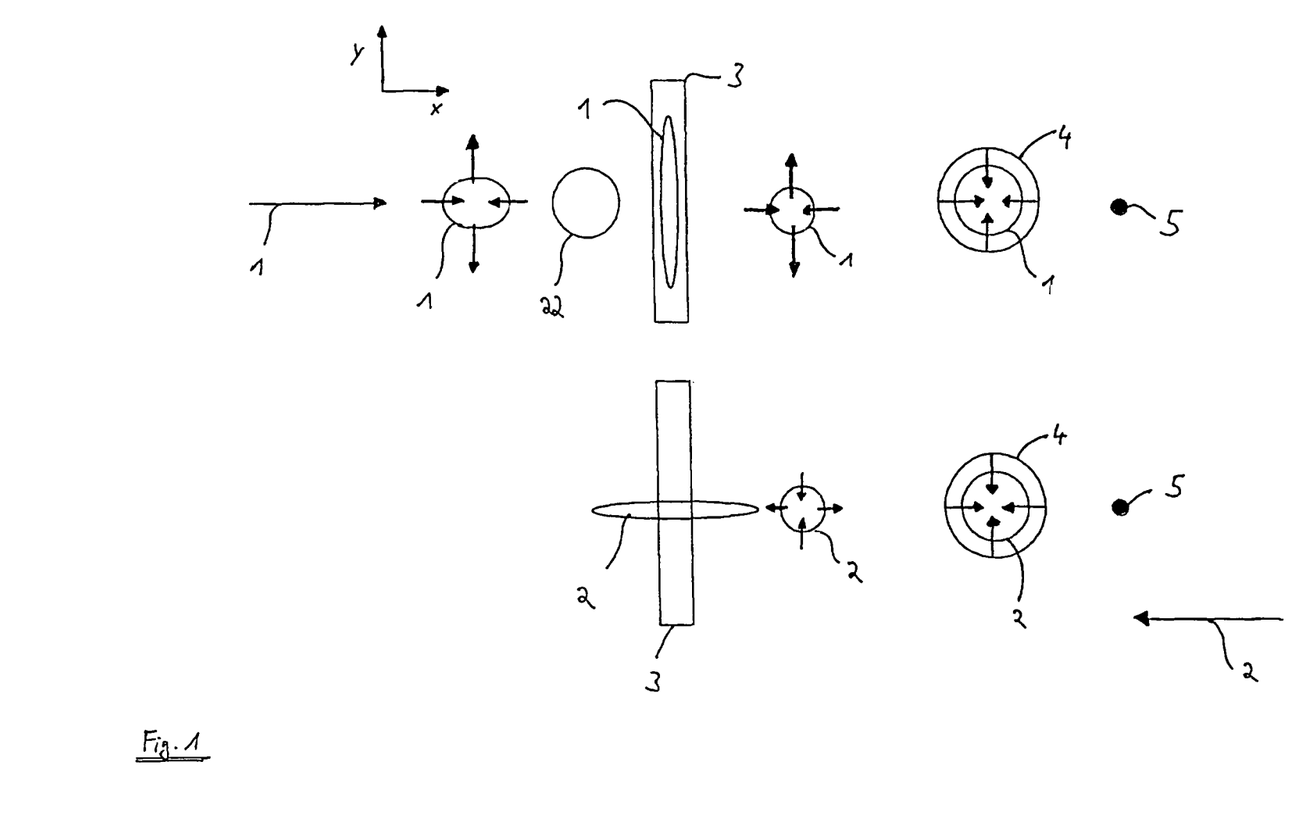
FIG. 1 shows a schematic diagram of the basic functioning of an embodiment of the system described herein.

FIG. 1 shows the basic functioning of an embodiment of the system described herein. A primary electron beam 1 runs along an optical axis of a scanning electron microscope. Primary electron beam 1, which is divergent up to this point, first passes through a first quadrupole setup in the beam path of the scanning electron microscope (the effect of the quadrupole is represented schematically by arrows). The quadrupole acts like a cylindrical lens, focusing primary electron beam 1 in a first direction (X direction) and defocusing in a second direction perpendicular to the former (Y direction). Primary electron beam 1 then passes through an aperture stop 22, the function of which was already described above. The position of aperture stop 22 is preferably selected in such a way that the beam cross section of primary electron beam 1 is rotationally symmetrical in the plane of the objective lens. Primary electron beam 1 then passes through a detection plane in which a detector (not shown) is situated. The longitudinal axis of primary electron beam 1 is aligned in the same direction as an opening 3 of the detector, which is preferably elongated. Opening 3 of the detector has at least such an extension that primary electron beam 1 is able to pass unhindered through opening 3. Another advantageous embodiment is a round detector opening which is easier to manufacture with the required surface quality and reduces the influence on the primary electron beam.

Another quadrupole is connected behind the detector (the effect is schematically indicated by arrows). Focusing of the first quadrupole in the X direction is strong enough to generate an astigmatic intermediate image of the second quadrupole from the source side. In the present exemplary embodiment, however, there is no intermediate image between the cathode (electron gun) and the sample in the Y direction.

The second quadrupole is excited in the same direction in relation to the first quadrupole, i.e., it acts with a focusing effect in the same direction (X direction). The cross section of primary electron beam 1 is focused and defocused in such a way that primary electron beam 1 is again rotationally symmetrical (round). An objective lens 4 then focuses primary electron beam 1 on a sample (not shown), focus 5 being in the form of a spot on the sample.

When primary electron beam 1 strikes the sample, electrons are emitted from the object (so-called secondary electrons) and electrons are backscattered by the object (so-called backscatter electrons). As a whole, they form secondary beam 2. Secondary beam 2 is accelerated and focused through objective lens 4 toward the detector. In doing so, the secondary electrons and backscatter electrons pass through the quadrupole which is connected between the detector and objective lens 4 and is implemented in this exemplary embodiment as a magnetic quadrupole. The quadrupole causes beam 2 of secondary electrons and/or backscatter electrons to be elliptically shaped, the large axis (longitudinal axis) of the ellipse being aligned perpendicular to the longitudinal axis of elongated opening 3 of the detector in the case of an opening 3 designed to be elongated. Only a small portion of the secondary electrons and/or backscatter electrons is able to pass through opening 3 in the detector due to the spreading of the secondary beam. The larger portion strikes the detection surface of the detector. The second quadrupole thus spreads the secondary beam. The effect of the second quadrupole on the primary electron beam is compensated by the first quadrupole.

Figure 2:
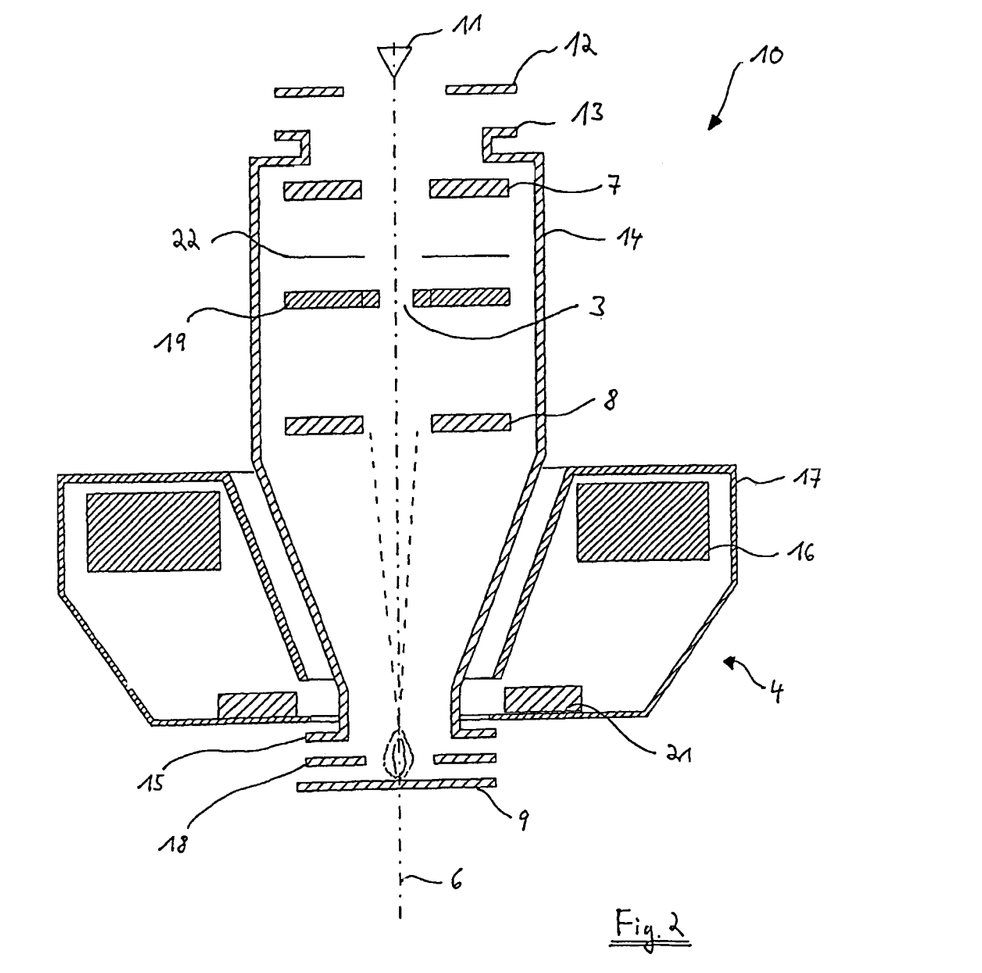
FIG. 2 shows a sectional schematic diagram of a scanning electron microscope having two quadrupoles.

FIG. 2 shows a schematic diagram of a scanning electron microscope 10 having two magnetic quadrupoles 7, 8 which are excited in the same direction and act in the same direction. Scanning electron microscope 10 has an electron gun in the form of an electron source 11 (cathode), an extraction electrode or control electrode 12, and an anode 13 which at the same time forms one end of a beam guidance tube 14 of scanning electron microscope 10. Electron source 11 is preferably a thermal field emitter. Electrons emerging from electron source 11 are accelerated to anode potential because of a potential difference between electron source 11 and anode 13.

Beam guidance tube 14 passes through a bore of pole shoes 17 of a magnetic lens 4 acting as the objective lens. Coils 16 such as those that have been known for a long time are provided in pole shoes 17. An electrostatic deceleration device is connected downstream from beam guidance tube 14. It has an electrode 18 and a tubular electrode 15 designed on the sample end of the beam guidance tube 14. Tubular electrode 15 is therefore at anode potential together with beam guidance tube 14, while electrode 18 and sample 9 are at a lower potential in comparison with the anode potential. In this way, the electrons of the primary electron beam may be decelerated to the desired low energy which is required for examination of the sample. Furthermore, a deflecting system 21 is provided for deflecting the primary electron beam and scanning it over sample 9.

For detection of secondary electrons or backscatter electrons which occur due to the interaction of the primary electron beam with sample 9, a detector 19 is provided in beam guidance tube 14 of scanning electron microscope 10, where it is situated above objective lens 4. The detector may be designed as a conversion electrode, which in turn generates secondary electrons of a low energy when struck by backscatter electrons or secondary electrons, which may be detected with a detector (not shown). Furthermore, detector 19 preferably has an elongated opening 3, preferably ellipsoidal or gap-shaped and optionally having an adjustable extension. In the exemplary embodiment depicted here, detector 19 has two detector elements arranged in such a way that they are movable with respect to one another.

Figure 3:
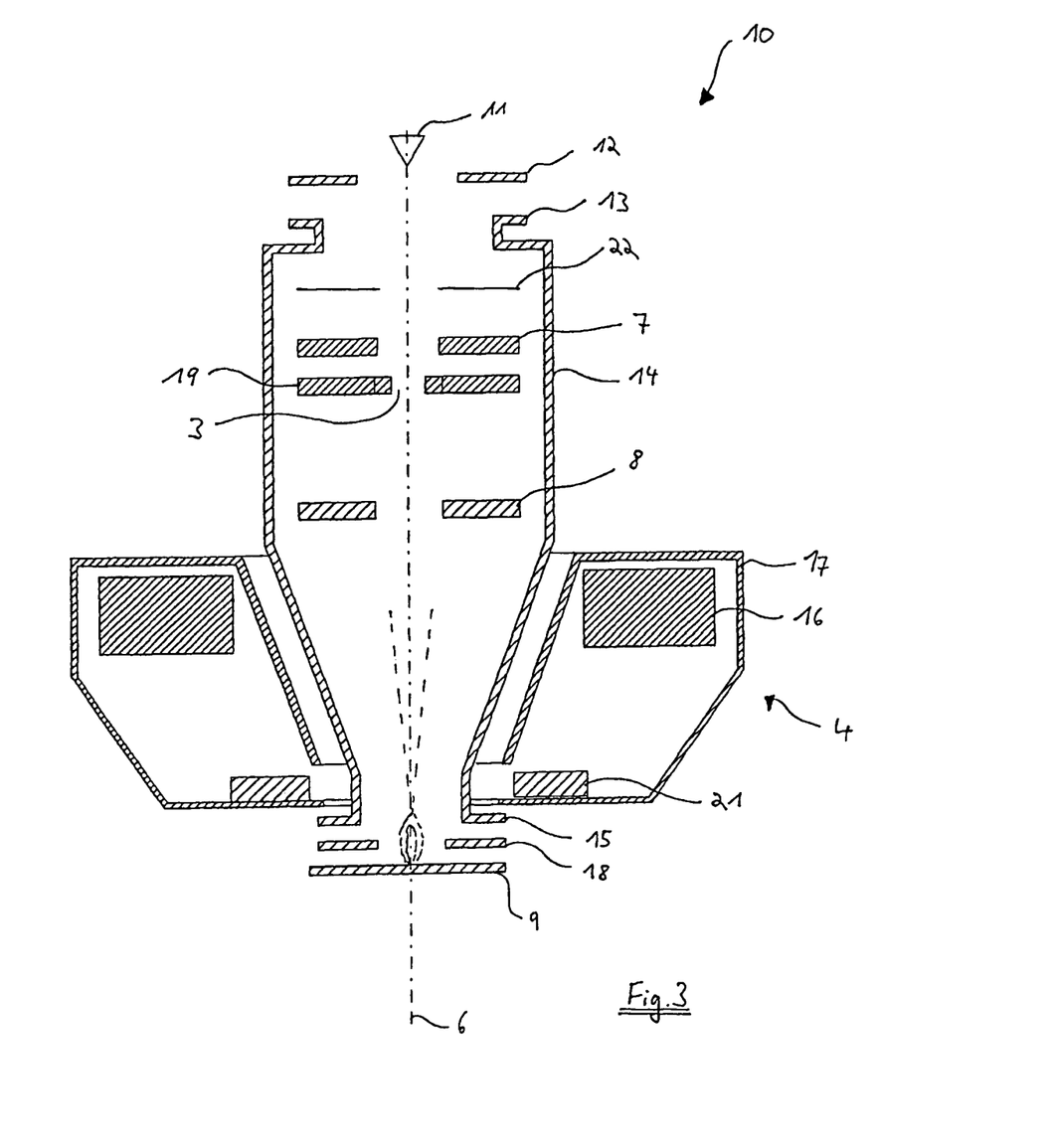
FIG. 3 shows another sectional schematic diagram of a scanning electron microscope having two quadrupoles.

An elliptical cross section of the primary electron beam in the objective lens 4 is obtained by situating an aperture stop 22 with a round opening above quadrupole 7. However, this is not advantageous due to the opening error of objective lens 4. Therefore, aperture stop 22 should have an elliptical opening if aperture stop 22 is situated above quadrupole 7 (see FIG. 3). As an alternative to this, aperture stop 22 having a round stop opening may be situated between quadrupole 7 and detector 19 in such a way as to form an (at least approximately) rotationally symmetrical (round) cross section of the primary electron beam in objective lens 4.

Figure 4:
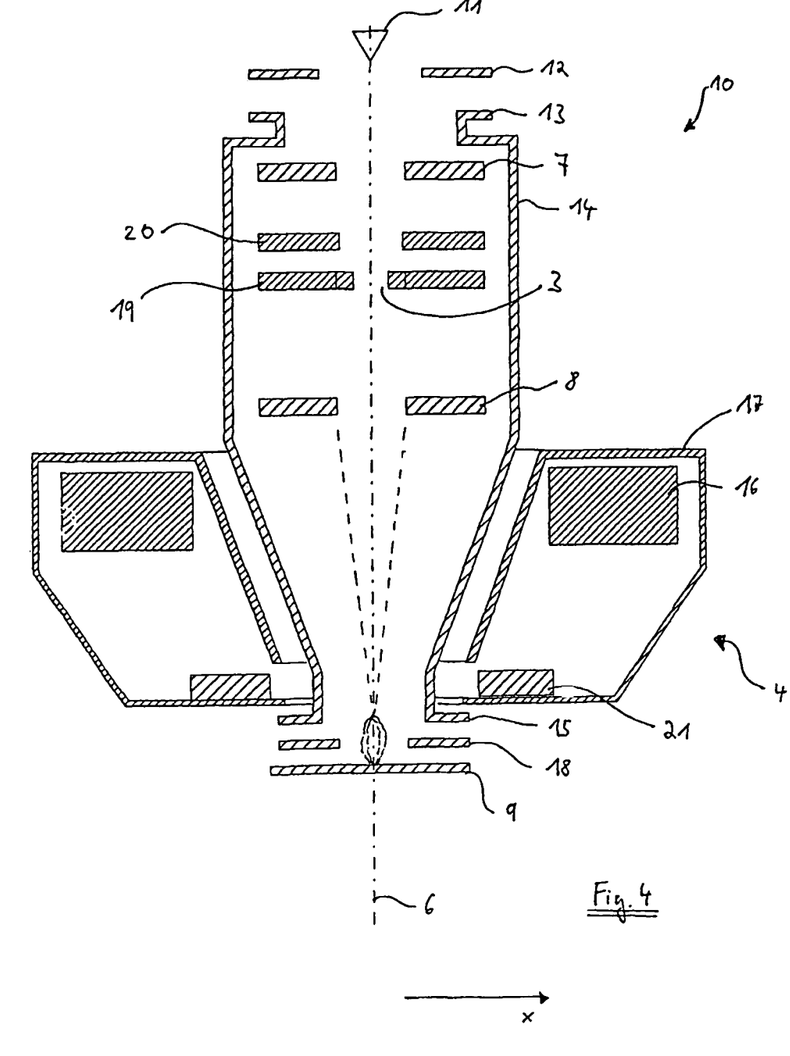
FIG. 4 shows a sectional schematic diagram of a scanning electron microscope having three quadrupoles.

FIG. 4 shows another exemplary embodiment of the present invention. Scanning electron microscope 10 shown in FIG. 4 corresponds essentially to the scanning electron microscope shown in FIGS. 2 and 3. However, instead of two quadrupoles, this exemplary embodiment has three quadrupoles 7, 8 and 20. First quadrupole 7 is situated in the area of electron gun 11 while second quadrupole 8 is situated in the area of objective lens 4. Third quadrupole 20 is situated between first quadrupole 7 and detector 19.

First and second quadrupoles 7, 8 are excited in the same direction. However, third quadrupole 20 is excited in the opposite direction from the two other quadrupoles 7, 8. An incident rotationally symmetrical primary electron beam is shaped elliptically by quadrupole 7. The primary electron beam then passes through opening 3 in detector 19, preferably designed to be elongated. The use of three quadrupoles results in a greater reduction of the source in both directions (both the X and Y directions). Furthermore, the rotationally symmetrical beam position of the cathode is imaged on the sample. The size of the image of the virtual source on the sample is thus equal in both directions. Therefore, the cross section of the primary electron beam always remains rotationally symmetrical after quadrupole 8. A rotationally symmetrical (round) cross section of the primary electron beam is always generated in quadrupole 8 by third quadrupole 20. To achieve this, its excitation must always be in the opposite direction from the excitation of quadrupole 7.

In principle, third quadrupole 20 may be situated in the entire area of beam guidance tube 14. However, it is preferably situated near opening 3 of detector 19 to avoid the need for very great excitation of the individual quadrupoles.

As shown here, quadrupole 8 is (electrostatically) situated above a crossover for the secondary electrons. In this way, quadrupole 8 acts on the secondary electrons in such a way that the extension of the secondary electron beam is increased in the direction perpendicular to opening 3 of detector 19, so that a great number of secondary electrons strikes detector 19.

Figure 5:
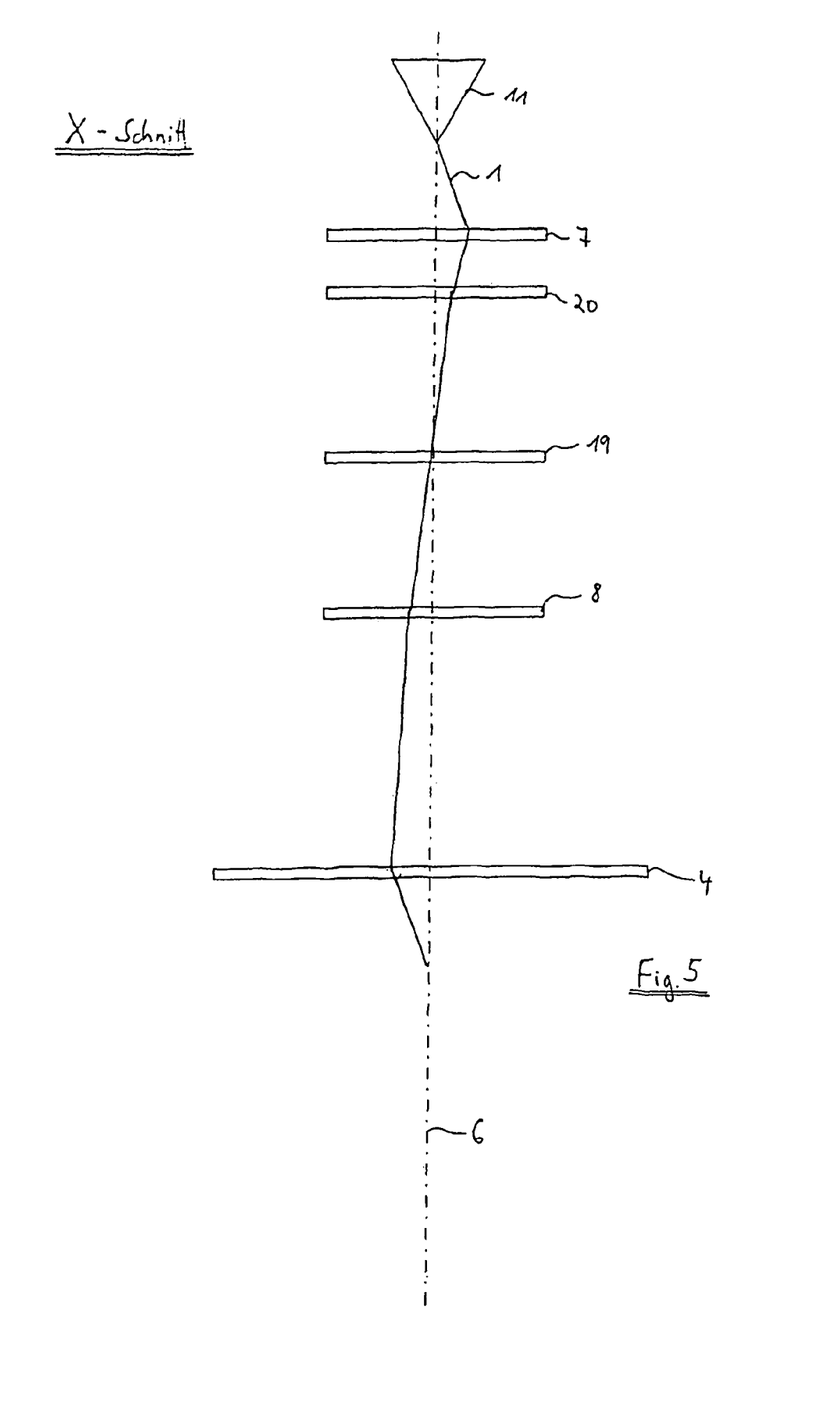
FIG. 5 shows a schematic diagram of the beam path in the X direction of a primary electron beam in the scanning electron microscope according to FIG. 4.
Figure 6:
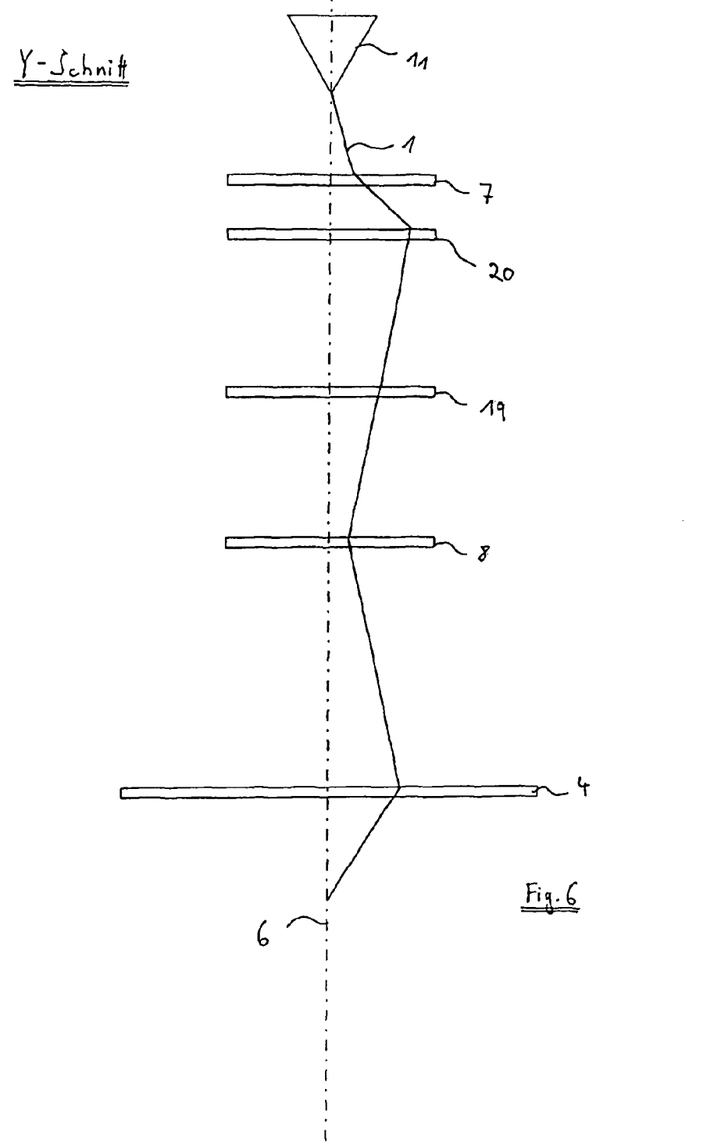
FIG. 6 shows another schematic diagram of the beam path in the Y direction of the primary electron beam in the scanning electron microscope according to FIG. 4.

FIGS. 5 and 6 show the course of primary electron beam 1 in scanning electron microscope 10. FIG. 5 shows a section in the X direction; FIG. 6 shows a section in the Y direction. In the X direction, primary electron beam 1 is first focused by quadrupole 7, i.e., deflected toward optical axis 6. Quadrupole 20 has a defocusing effect on primary electron beam 1 before striking detector 19. Primary electron beam 1 then passes through the opening in detector 19. Quadrupole 8 has a focusing effect on primary electron beam 1 and images primary electron beam 1 on objective lens 4. FIG. 6 shows the section in the Y direction. First, primary electron beam 1 is defocused by quadrupole 7. Quadrupole 20 has a focusing effect on primary electron beam 1 before primary electron beam 1 passes through the opening in detector 19. However, quadrupole 8 has a defocusing effect on primary electron beam 1 before the latter strikes objective lens 4.

Figure 7:
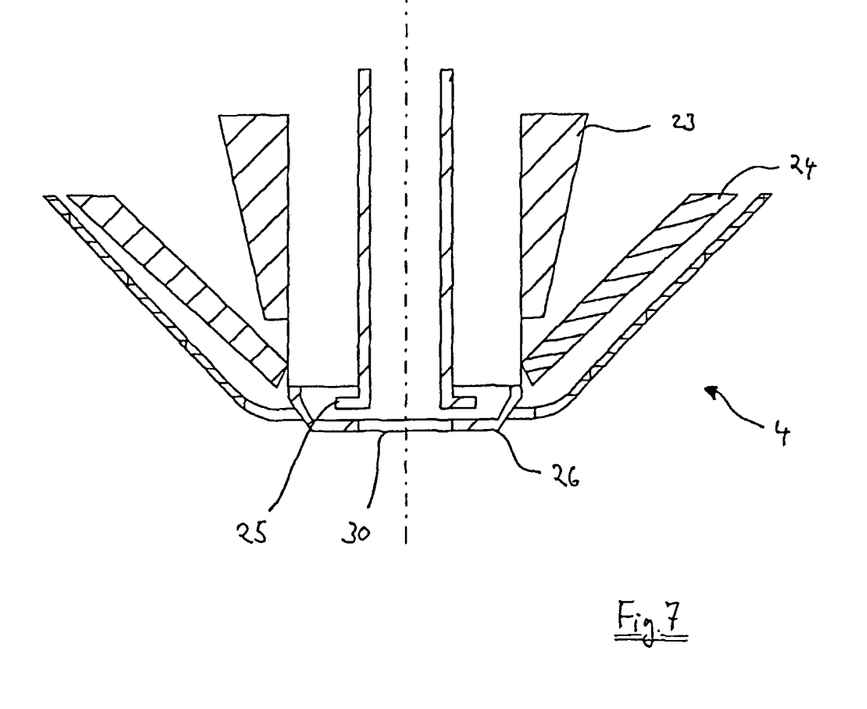
FIG. 7 shows a schematic diagram of the design of an objective lens on the object side of the scanning electron microscope.

FIG. 7 schematically shows a diagram of the object end of an objective lens 4 having pole shoes 23, 24 of a magnetic lens and electrodes 25, 26 of an electrostatic lens, the configuration and function thereof being known from the related art.

Electrode 26 is designed in the form of a covering cap having an opening 30. It is held on objective lens 4 by a spring strap system (not shown). As already described, it is advantageous to provide a quadrupole device on the object side in front of the electrostatic lens 25, 26 because the quadrupole field has a much stronger effect on the "slow" secondary electrons than on "faster" electrons of the primary electron beam. In addition, the beam height of the secondary electrons and thus the effective strength is much greater in comparison with the primary electron beam. Electrode 26 is to be designed as part of the quadrupole device. This embodiment may also be implemented, for example, in the embodiments of the present invention described above.

Figure 8:
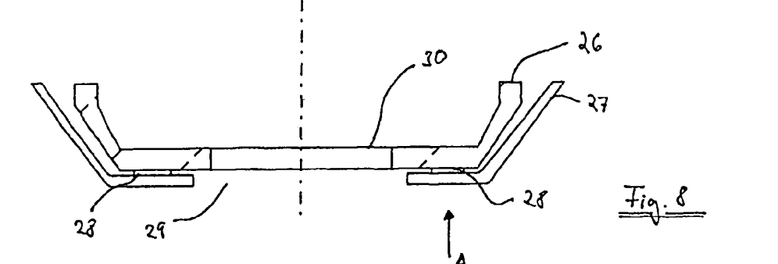
FIGS. 8, 8a show a schematic diagram of a quadrupole device situated on the object side.
Figure 8A:
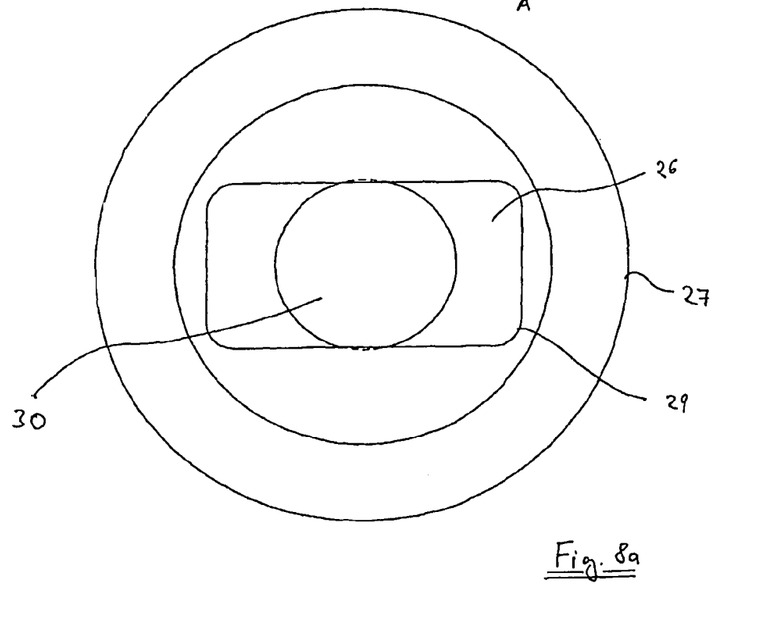

FIG. 8 shows a schematic diagram of a quadrupole device in the form of a quadrupole in a sectional diagram. Another electrode 27 having a nonround opening 29 is provided on electrode 26 via insulators 28. FIG. 8*a* shows a top view in the direction of arrow A according to FIG. 8, rotated by 90°. In this exemplary embodiment, electrode 27 is at ground while electrode 26 is at a variable potential. It is thus possible to switch between a weak quadrupole (electrode 26 also at ground) and a strong quadrupole (electrode 26 at a positive potential).

In the case of the weak quadrupole, the embodiment described above has the advantage that the quadrupole field is implemented by a nonround opening 29 of electrode 27 situated beneath electrode 26 only with the field passage of the electrostatic lens. Furthermore, this is a particularly simple and inexpensive approach. At the same time, electrode 27 functions as touch protection so that the sample to be examined is not brought in contact with electrode 26.

Figure 9:
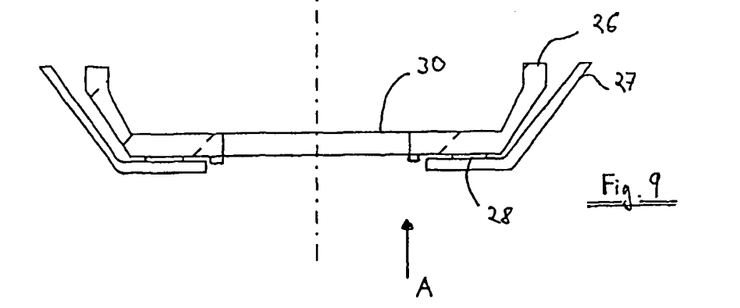
FIGS. 9, 9a show a schematic diagram of another quadrupole device situated on the object side of the objective lens.
Figure 9A:
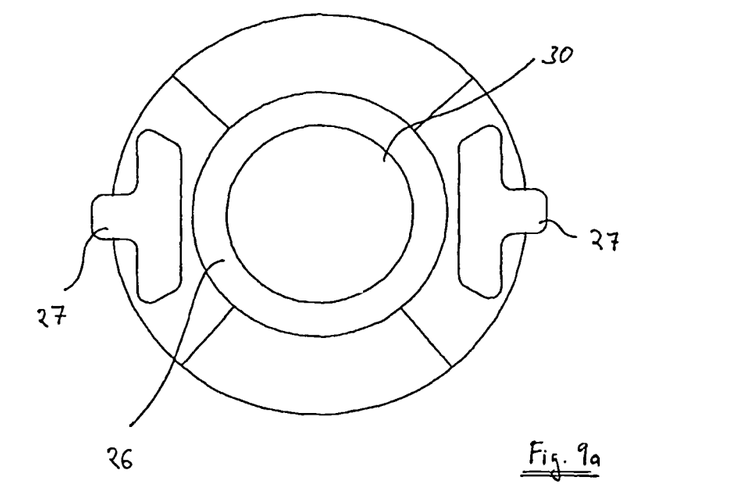

FIGS. 9 and 9*a* show another exemplary embodiment of a quadrupole device according to the present invention situated on the object side of the objective lens. This embodiment—like the exemplary embodiment depicted in FIG. 7—also has an electrode 26 of an electrostatic lens, electrode 26 in turn being equipped with an opening 30. An electrode 27 in the form of two diametrically positioned electrode elements is provided on the side of electrode 26 facing the object via insulators. Electrodes 26 and 27 each have such a potential that a quadrupole field is generated.

The exemplary embodiments depicted in FIGS. 7 through 9 preferably have another quadrupole which is situated in the electron beam device on the side of the objective lens facing the electron gun, e.g., in the manner already described above. This additional quadrupole is provided to compensate for the astigmatism of the primary electron beam generated by the quadrupole device situated on the object side of the objective lens.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

The invention claimed is:

1. An electron beam device, comprising:
an electron gun for generating an electron beam;
an objective lens for focusing the electron beam on an object;
at least one detector for detecting a secondary beam of electrons emitted by the object or backscattered by the object, the detector having an opening for the passage of the electron beam in the direction of the object; and
a first quadrupole device and a second quadrupole device situated in series, wherein the second quadrupole device is situated between the at least one detector and the objective lens and shapes a beam cross section of the secondary beam of the electrons emitted by the object or backscattered by the object, and wherein the first quadrupole device compensates for an effect of the second quadrupole device on the electron beam.

2. The electron beam device as recited in claim 1, wherein the detector is situated symmetrically with respect to the beam axis of the electron beam in the electron beam device.

3. The electron beam device as recited in claim 1, wherein the first and second quadrupole devices are excited in the same direction.

4. The electron beam device as recited in claim 1, wherein an aperture stop is situated in front of one of the quadrupole devices.

5. The electron beam device as recited in claim 4, wherein the aperture stop is situated between the first quadrupole device and the detector.

6. The electron beam device as recited in claim 1, wherein a third quadrupole device is provided in addition to the first and second quadrupole devices, and the first, second, and third quadrupole devices are situated in series.

7. The electron beam device as recited in claim 6, wherein two quadrupole devices are excited in the same direction and one quadrupole device is excited in the opposite direction.

8. The electron beam device as recited in claim 1, wherein the detector is situated between two quadrupole devices.

9. The electron beam device as recited in claim 1, wherein the quadrupole devices are designed as magnetic or electrostatic quadrupoles.

10. The electron beam device as recited in claim 1, wherein the second quadrupole device is situated closer to the object than the first quadrupole device and the second quadrupole device is situated in the area of the objective lens.

11. The electron beam device as recited in claim 1, wherein the first quadrupole device is situated in the area of the electron gun.

12. The electron beam device as recited in claim 1, wherein the objective lens has a side facing the electron gun and a side facing the object and is equipped with a magnetic lens and an electrostatic lens, having a first and second electrode, the second electrode is situated on the object side and is at a smaller distance from the object than the first electrode, and one of the quadrupole devices is situated on the object side and the second electrode forms the quadrupole device at least partially.

13. The electron beam device as recited in claim 12, wherein another of the quadrupole devices is situated above the crossover of the emitted electrons (secondary electrons) in which the electrons (secondary electrons) emitted by the object are imaged.

14. The electron beam device as recited in claim 12, wherein the quadrupole device comprises a component having an opening and the electron beam passes through this opening in the direction of the object.

15. The electron beam device as recited in claim 14, wherein the opening in the component is nonround.

16. The electron beam device as recited in claim 12, wherein the component is situated on the second electrode.

17. The electron beam device as recited in claim 12, wherein the component is integrated into the second electrode.

18. The electron beam device as recited in claim 12, wherein the second electrode has an object side on which the component is situated.

19. The electron beam device as recited in claim 18, wherein the component is separated by insulators from the second electrode.

20. The electron beam device as recited in claim 18, wherein the component and the second electrode are at a preselectable potential and the potential of the second electrode is variably adjustable.

21. The electron beam device as recited in claim 20, wherein the component is grounded.

22. The electron beam device as recited in claim 1, wherein the detector has an adjustable opening.

23. The electron beam device as recited in claim 1, wherein the opening in the detector is elliptical or gap shaped.

24. The electron beam device as recited in claim 23, wherein the detector is situated in a focus of one of the quadrupole devices.

25. The electron beam device as recited in claim 1, wherein the detector has at least two detector elements to form the opening.

26. The electron beam device as recited in claim 1, wherein the detector is designed as a conversion stop.

27. An electron beam device, comprising:
an electron gun for generating an electron beam;
an objective lens for focusing the electron beam on an object, the objective lens having a side facing the electron gun and a side facing the object;
at least one detector for detecting a secondary beam of electrons emitted by the object or backscattered by the object, the detector having an opening for the passage of the electron beam in the direction of the object; and
at least one quadrupole device situated on the objective lens on the object side, wherein the at least one quadrupole device shapes the secondary beam.

28. A method for detection of electrons in an electron beam device, comprising:
generating a primary electron beam and guiding the primary electron beam through the electron beam device; and
generating electrons when the primary electron beam strikes an object to be examined, wherein the electrons form a secondary beam,
wherein the primary electron beam passes through a first quadrupole that shapes the beam cross section of the primary electron beam in such a way that the primary electron beam then passes through an opening in a detector in the direction of the object to be examined,
wherein the primary electron beam then passes through a second quadrupole that shapes the beam cross section of the primary electron beam in such a way that it is again essentially rotationally symmetrical, wherein the second quadrupole is situated between the detector and the objective lens, and
wherein the secondary beam passes through the second quadrupole and is shaped by the second quadrupole in such a way that only a small portion of the electrons of the secondary beam passes through the opening in the detector and the greater portion is detected by the detector.

29. The method as recited in claim 28, wherein the primary electron beam passes through a third quadrupole.

30. The electron beam device as recited in claim 15, wherein the opening in the component is elliptical.

31. An electron beam device, comprising:
an electron gun for generating an electron beam;
an objective lens for focusing the electron beam on an object;
at least one detector for detecting a secondary beam of electrons emitted by the object or backscattered by the object, the detector having an opening for the passage of the electron beam in the direction of the object; and
a first quadrupole device and a second quadrupole device situated in series, wherein the second quadrupole device is situated between the at least one detector and the objective lens and shapes the secondary beam of the electrons emitted by the object or backscattered by the object, wherein the first quadrupole device compensates for an effect of the second quadrupole device on the electron beam, and wherein the at least one detector is situated between the first quadrupole device and the second quadrupole device.

32. The electron beam device as recited in claim 31, wherein the secondary beam is shaped such that only a first portion of the secondary beam passes through the opening of the detector and a second portion of the secondary beam strikes a detection surface of the detector, the second portion being greater than the first portion.

33. An electron beam device, comprising:
an electron gun for generating an electron beam;
an objective lens for focusing the electron beam on an object;
at least one detector for detecting a secondary beam of electrons emitted by the object or backscattered by the object, the detector having an opening for the passage of the electron beam in the direction of the object; and
a first quadrupole device and a second quadrupole devices situated in series, wherein the second quadrupole device is situated between the at least one detector and the objective lens and shapes the secondary beam of the electrons emitted by the object or backscattered by the object, wherein the secondary beam is shaped such that only a first portion of the secondary beam passes through the opening of the detector and a second portion of the secondary beam strikes a detection surface of the detector, the second portion being greater than the first portion.

34. The electron beam device as recited in claim 27, wherein the secondary beam is shaped such that only a first portion of the secondary beam passes through the opening of the detector and a second portion of the secondary beam strikes a detection surface of the detector, the second portion being greater than the first portion.

35. The method as recited in claim 28, wherein the detector is situated between the first quadrupole and the second quadrupole.

* * * * *